US006761972B2

(12) United States Patent
Kasai et al.

(10) Patent No.: US 6,761,972 B2
(45) Date of Patent: Jul. 13, 2004

(54) DIRECT DRAWING TYPE LITHOGRAPHIC PRINTING PLATE PRECURSOR

(75) Inventors: Seishi Kasai, Shizuoka (JP); Eiichi Kato, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 199 days.

(21) Appl. No.: 10/094,612

(22) Filed: Mar. 12, 2002

(65) Prior Publication Data

US 2003/0024426 A1 Feb. 6, 2003

(30) Foreign Application Priority Data

Mar. 12, 2001 (JP) .................................... P 2001-068848

(51) Int. Cl.$^7$ ............................ G03F 7/00; B32B 9/04; B32B 27/00; B32B 27/08; B32B 27/40

(52) U.S. Cl. ................................ 428/411.1; 428/423.1; 428/424.2; 428/425.1; 428/425.8; 428/474.4; 428/476.3; 428/479.3; 428/479.6; 428/480; 428/481; 428/483; 428/500; 428/507; 428/515; 428/524; 428/526

(58) Field of Search .......................... 428/411.1, 423.1, 428/424.2, 425.1, 425.8, 474.4, 476.3, 479.3, 479.6, 480, 481, 483, 500, 507, 515, 524, 526

(56) References Cited

U.S. PATENT DOCUMENTS

| | | | | | |
|---|---|---|---|---|---|
| 6,283,029 B1 | * | 9/2001 | Tashiro et al. | .............. | 101/455 |
| 6,393,985 B1 | * | 5/2002 | Tashiro et al. | .............. | 101/462 |
| 6,440,623 B2 | * | 8/2002 | Tashiro et al. | ................ | 430/49 |
| 6,453,815 B1 | * | 9/2002 | Tashiro et al. | .............. | 101/462 |
| 6,472,055 B1 | * | 10/2002 | Tashiro et al. | .............. | 428/212 |
| 6,479,203 B1 | * | 11/2002 | Tashiro et al. | .............. | 430/104 |

FOREIGN PATENT DOCUMENTS

| | | |
|---|---|---|
| JP | 3-042679 | 2/1991 |
| JP | 10-268583 | 10/1998 |

* cited by examiner

*Primary Examiner*—Nathan M. Nutter
(74) *Attorney, Agent, or Firm*—Burns, Doane, Swecker & Mathis, L.L.P.

(57) ABSTRACT

A direct drawing type lithographic printing plate precursor comprising a water-resistant support and an image-receiving layer, the image-receiving layer comprising a filler and a binder resin, wherein the filler comprises a porous filler, and the binder resin comprises a complex comprising a resin containing a bond in which a metal atom is connected with an oxygen atom and an organic polymer containing a group capable of forming a hydrogen bond with the resin.

17 Claims, 2 Drawing Sheets

DIRECT DRAWING TYPE LITHOGRAPHIC PRINTING PLATE PRECURSOR

FIELD OF THE INVENTION

The present invention relates to a direct drawing type lithographic printing plate precursor and, more particularly, to a direct drawing type lithographic printing plate precursor capable of providing a lithographic printing plate which enables to print a great number of printed matters having clear images free from background stain.

BACKGROUND OF THE INVENTION

Lithographic printing plate precursors which are mainly used at present in the filed of small-scale commercial printing include (1) a direct drawing type lithographic printing plate precursor comprising a water-resistant support having provided thereon a hydrophilic image-receiving layer, (2) a printing plate precursor comprising a water-resistant support having provided thereon a lipophilic image-receiving layer comprising zinc oxide, which is converted into a printing plate by undergoing direct drawing image formation and then oil-desensitizing treatment with an oil-desensitizing solution to render the non-image area hydrophilic, (3) a printing plate precursor of an electrophotographic light-sensitive material comprising a water-resistant support having provided thereon a photoconductive layer comprising photoconductive zinc oxide, which is converted into a printing plate by undergoing image formation and then oil-desensitizing treatment with an oil-desensitizing solution to render the non-image area hydrophilic, and (4) a printing plate precursor of a silver-halide photographic material comprising a water-resistant support having provided thereon a silver halide emulsion layer.

With the development of office appliances and the expansion of office automation in recent years, it has been desired in the field of printing to adopt an offset printing system wherein a lithographic printing plate is directly prepared from the direct drawing type printing plate precursor (1) described above utilizing various image forming means, e.g., an electrophotographic printer, a thermal transfer printer or an ink jet printer without undergoing any other special treatment for conversion into the printing plate.

A conventional direct drawing type lithographic printing plate precursor comprises a support such as paper, having on one surface side thereof an image-receiving layer which is a surface layer provided via an interlayer and on the other surface side thereof a back layer. The interlayer and the back layer are each composed of a water-soluble resin such as PVA or starch, a water-dispersible resin such as a synthetic resin emulsion, and a pigment. The image-receiving layer ordinarily comprises an inorganic pigment, a water-soluble resin and a water resisting agent.

Examples of the inorganic pigment used include kaolin, clay, talc, calcium carbonate, silica, titanium oxide, zinc oxide, barium sulfate and alumina.

Examples of the water-soluble resin used include polyvinyl alcohol (PVA), a modified PVA such as a carboxylated PVA, starch and a derivative thereof, a cellulose derivative such as carboxymethyl cellulose or hydroxyethyl cellulose, casein, gelatin, polyvinyl pyrrolidone, a vinyl acetate-crotonic acid copolymer and a styrene-maleic acid copolymer.

Examples of the water resisting agent used include glyoxal, an initial condensate of aminoplast such as a melamine-formaldehyde resin or a urea-formaldehyde resin, a modified polyamide resin such as a methylolated polyamide resin, a polyamide-polyamine-epichlorohydrin adduct, a polyamide-epichlorohydrin resin and a modified polyamide-polyimide resin.

It is also known that a cross-linking catalyst such as ammonium chloride or a silane coupling agent can be used in addition to the above described components.

Further, it is proposed that as a binder resin used in an image-receiving layer of a direct drawing type lithographic printing plate precursor, a resin having a functional group capable of forming a carboxy group, a hydroxy group, a thiol group, an amino group, a sulfo group or a phosphono group upon decomposition and being previously crosslinked with heat-curing or light-curing groups included therein is used as described in JP-A-1-226394, JP-A-1-269593 and JP-A-1-288488 (the term "JP-A" as used herein means an "unexamined published Japanese patent application"), a resin having the above-described functional group is used together with a heat-curing or light-curing resin as described in JP-A-1-266546, JP-A-1-275191 and JP-A-1-309068, or a resin having the above-described functional group is used together with a curing agent as described in JP-A-1-267093, JP-A-1-271292 and JP-A-1-309067, for the purpose of improving hydrophilicity of the non-image area, film strength of the image-receiving layer and printing durability.

For improving hydrophilicity of the non-image area, it is also proposed that resin particles having a minute particle size of one μm or less and containing a hydrophilic group, for example, a carboxy group, a sulfo group or a phosphono group as described in JP-A-4-201387 and JP-A-4-223196, or resin particles having a minute particle size and containing a functional group capable of forming the hydrophilic group as described above upon decomposition as described in JP-A-4-319491, JP-A-4-353495, JP-A-5-119545, JP-A-5-58071 and JP-A-5-69684 are incorporated into the image-receiving layer together with the inorganic pigment and the binder resin.

However, in order to improve printing durability of a printing plate obtained by a conventional manner as described above, if the hydrophobicity of the printing plate is enhanced by adding a large amount of the water resisting agent or by using a hydrophobic resin, printing stain due to the decrease in hydrophilicity occurs although the printing durability is improved. On the contrary, the enhancement of hydrophilicity results in lowering of the water resistance to cause deterioration of the printing durability.

In particular, when the printing plate is used under a high temperature condition of 30° C. or more, it has a defect that the surface layer thereof is dissolved in dampening water used for offset printing to result in deterioration of the printing durability and occurrence of printing stain. Moreover, in case of a direct drawing type lithographic printing plate precursor, since images are directly drawn on an image-receiving layer of the printing plate precursor with oil-based ink, poor adhesion of the oil-based ink to the image receiving layer causes falling off of the oil-based ink in the image area during printing, thereby deteriorating the printing durability even if the occurrence of printing stain in the non-image area is prevented because of sufficient hydrophilicity. This problem has not yet come to a satisfactory solution.

On the other hand, a printing plate precursor having a hydrophilic layer containing titanium oxide, polyvinyl alcohol and hydrolyzed tetramethoxysilane or tetraethoxysilane as an image-receiving layer has been proposed as described, for example, in JP-A-3-42679 and JP-A-10-268583. As a result of plate-making using such a printing plate precursor to prepare a printing plate and printing using the printing plate, however, it has been practically found that printing durability of the image is insufficient.

SUMMARY OF THE INVENTION

The present invention aims to solve these problems which conventional direct drawing type lithographic printing plate precursors have been encountered.

Therefore, an object of the present invention is to provide a direct drawing type lithographic printing plate precursor providing a printing plate free from not only background stain over an entire surface but also dot-like stain.

Another object of the present invention is to provide a direct drawing type lithographic printing plate precursor capable of forming a printing plate which can provide a great number of printed matters having clear images free from background stain and disappearance or distortion of images.

Other objects of the present invention will become apparent from the following description.

It has been found that these objects of the present invention are accomplished with the following direct drawing type lithographic printing plate precursors:

(1) A direct drawing type lithographic printing plate precursor comprising a water-resistant support having provided thereon an image-receiving layer, the image-receiving layer comprises at least one porous filler and a binder resin, the binder resin comprises a complex comprising a resin containing a bond in which a metal atom is connected with an oxygen atom and an organic polymer containing a group capable of forming a hydrogen bond with the resin, (2) The direct drawing type lithographic printing plate precursor as described in item (1) above, wherein the porous filler has an average pore diameter distribution of from 1 angstrom to 1 $\mu$m, (3) The direct drawing type lithographic printing plate precursor as described in item (1) or (2) above, wherein the porous filler has an average specific surface of from 0.05 to 5,000 $m^2/g$, (4) The direct drawing type lithographic printing plate precursor as described in any one of items (1) to (3) above, wherein the porous filler is composed of an inorganic substance, (5) The direct drawing type lithographic printing plate precursor as described in any one of items (1) to (4) above, wherein the porous filler is present in an amount of at least 25% by weight based on the total amount of filler, (6) The direct drawing type lithographic printing plate precursor as described in any one of items (1) to (5) above, wherein a mixing ratio of the binder to the total filler is from 80/20% by weight to 5/95% by weight in terms of a ratio of the binder/the total filler.

BRIEF DESCRIPTION OF THE ACCOMPANYING DRAWINGS

Figure 1:
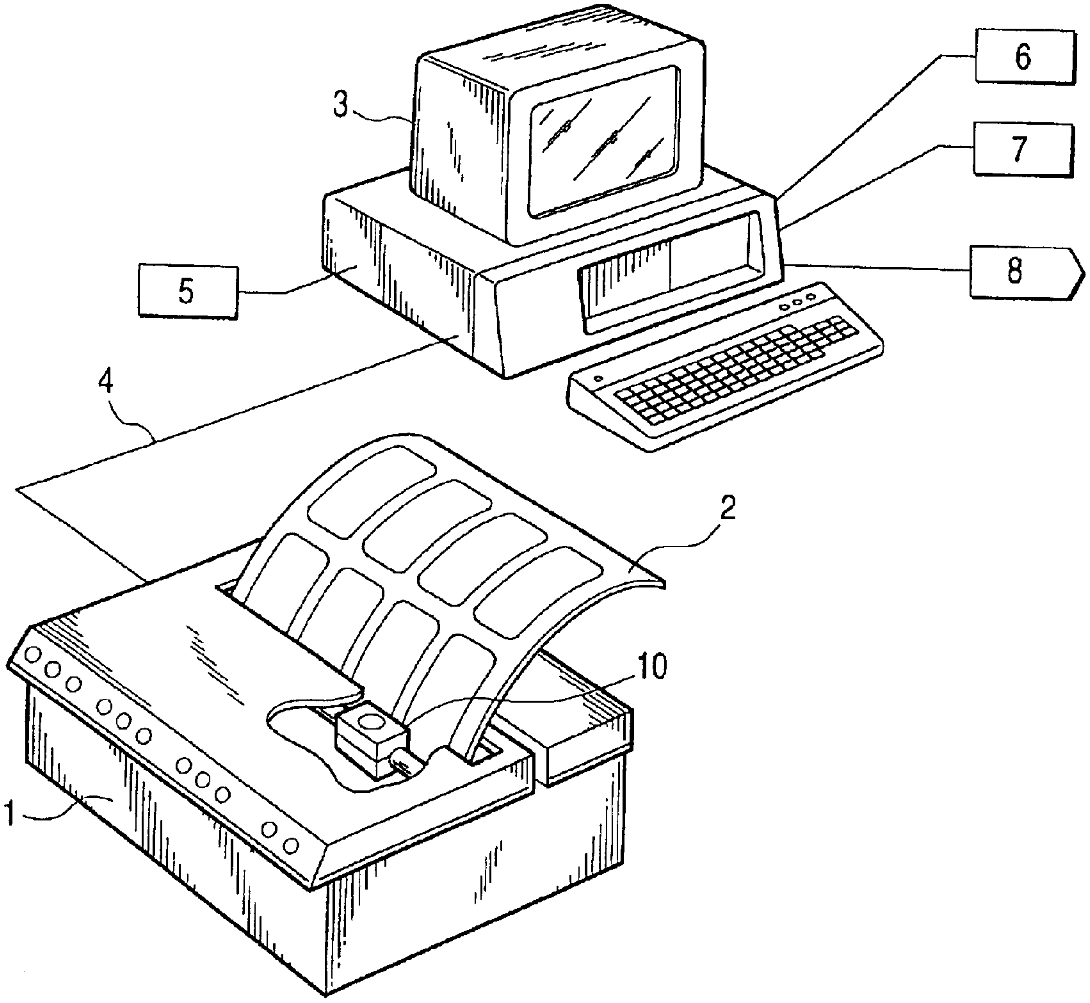
FIG. 1 is a schematic view showing an example of an apparatus system which is utilized for the formation of image on the direct drawing type lithographic printing plate precursor of the present invention.

In these figures, the numerals denote the following members, respectively:

| | |
|---|---|
| 1 | Ink jet recording device |
| 2 | Lithographic printing plate precursor (Master) |
| 3 | Computer |
| 4 | Bus |
| 5 | Video camera |
| 6 | Hard disk |
| 7 | Floppy disk |
| 8 | Mouse |
| 10 | Head |
| 10a | Ejection slit |
| 10b | Ejection electrode |
| 10c | Counter electrode |
| 11 | Oil-based ink |
| 101 | Upper unit |
| 102 | Lower unit |

DETAILED DESCRIPTION OF THE INVENTION

The present invention will be described in greater detail below.

The direct drawing type lithographic printing plate precursor of the present invention comprises a water-resistant support having provided thereon an image-receiving layer containing a porous filler and as a binder resin a complex comprising a resin containing a bond in which a metal atom is connected with an oxygen atom (hereinafter also referred to as a metal-containing resin) and an organic polymer containing a group capable of forming a hydrogen bond with the metal-containing resin.

In the dispersion comprising the porous filler and the complex comprising the metal-containing resin and the organic polymer according to the present invention, interaction between each of the components is strong. As a result of improvement in dispersibility of the porous filler, a film excellent in printing durability is obtained by plate-making. Further, the porous fillers form the special surface shape, specifically fine irregularity, in the image-receiving layer, and when an image is heated for fixing on the image-receiving layer, the resin component of the image melts and adheres to the fine irregularity. Due to such an anchor effect of the fine irregularity based on the porous fillers the printing durability is further improved. In addition, water retention on the surface of image-receiving layer is sufficiently maintained during printing. Therefore, both the excellent image adhesion and the hydrophilicity are achieved.

Filers conventionally used, for example, inorganic particles or organic particles are not porous. These filers generally have an average pore diameter distribution of not less than 1 angstrom and an average specific surface of approximately 0.001 $m^2/g$. Thus, the use of the porous filler in the image-receiving layer according to the present invention is not known.

The porous filler for use in the image-receiving layer according to the present invention is described in detail below.

The porous filler is not particularly limited and may be an inorganic substance or an organic substance.

The inorganic porous filler includes metal, an oxide, a compound oxide, a hydroxide, a carbonate, a sulfate, a silicate, a phosphate, a nitride, a carbide, a sulfide and a composite compound of two or more thereof. Specific examples of the inorganic porous filler include glass, silica, titanium oxide, zinc oxide, alumina, zirconium oxide, tin oxide, potassium titanate, aluminum borate, magnesium oxide, magnesium borate, aluminum hydroxide, magnesium hydroxide, calcium hydroxide, basic magnesium sulfate, calcium carbonate, magnesium carbonate, calcium sulfate, magnesium sulfate, calcium silicate, magnesium silicate, calcium phosphate, silicon nitride, titanium nitride, aluminum nitride, silicon carbide, titanium carbide, zinc sulfide, zeolite and a composite compound of two or more thereof. Preferred examples thereof include glass, silica, titanium oxide, alumina, zeolite, magnesium oxide, aluminum hydroxide, magnesium hydroxide, calcium hydroxide, calcium carbonate, magnesium carbonate, calcium silicate, magnesium silicate, calcium phosphate and calcium sulfate.

The organic porous filler includes a carbon compound, a polymer compound, a cellulose and a composite of at least one thereof with an inorganic compound. Specific examples of the organic porous filler include charcoal, activated carbon, a polymer porous sintered product, a resin foam, a porous silicone and a highly water absorptive resin. Preferred examples thereof include charcoal, activated carbon, a polymer porous sintered product and a highly water absorptive resin.

With respect to a size of the porous filler, an average particle diameter is preferably from 0.03 to 20 $\mu$m, more preferably from 0.05 to 15 $\mu$m, and still more preferably from 0.1 to 10 $\mu$m.

With respect to a pore diameter of the porous filler, an average pore diameter distribution is preferably from 1 angstrom to 1 $\mu$m, more preferably from 10 angstroms to 500 nm, and still more preferably from 50 angstroms to 300 nm.

With respect to a surface area of the porous filler, an average specific surface is preferably from 0.05 to 5,000 $m^2/g$, more preferably from 1 to 3,000 $m^2/g$, and still more preferably from 10 to 1,000 $m^2/g$.

A filler other than the porous filler described above may be used together with the porous filler. Such a filler is not particularly limited and may be an inorganic particle or an organic particle.

The inorganic particle includes metal powder, a metal oxide, a metal nitride, a metal sulfide, a metal carbide and a composite compound thereof, and preferably a metal oxide and a metal sulfide. More preferred examples thereof include a particle of glass, $SiO_2$, $TiO_2$, ZnO, $Fe_2O_3$, $ZrO_2$, $SnO_2$, ZnS and CuS.

The organic particle includes a synthesis resin particle and a natural polymer particle. Preferred examples thereof include a particle of acrylic resin, polyethylene, polypropylene, polyethylene oxide, polypropylene oxide, polyethylene imine, polystyrene, polyurethane, polyurea, polyester, polyamide, polyimide, carboxymethyl cellulose, gelatin, starch, chitin and chitosan. More preferred examples include a particle of acrylic resin, polyethylene, polypropylene and polystyrene.

An amount of the porous filler is not less than 25% by weight, preferably not less than 50% by weight, and still more preferably not less than 75% by weight, based on the total amount of filler used in the image-receiving layer.

A mixing ratio of the binder to the total filler is from 80/20% by weight to 5/95% by weight, preferably from 70/30% by weight to 5/95% by weight, and still more preferably from 60/40% by weight to 5/95% by weight in terms of the binder/the total filler.

The binder resin for use in the image-receiving layer according to the present invention is described in detail below.

The binder resin according to the present invention is characterized by comprising a complex comprising a resin containing a bond in which a metal atom is connected with an oxygen atom (i.e., a metal-containing resin) and an organic polymer containing a group capable of forming a hydrogen bond with the metal-containing resin. The term "complex comprising a metal-containing resin and an organic polymer" means and includes both a sol substance and a gel substance.

The metal-containing resin means a polymer mainly containing a bond comprising "oxygen atom-metal atom-oxygen atom".

The term "metal atom" used herein means and includes transition metal atoms, rare earth metal atoms and metal atoms of III to V groups of the periodic table, for example, Al, Si, Sn, Ge, Ti and Zr.

The metal-containing resin for use in the present invention is preferably a polymer obtained by a hydrolysis polymerization condensation reaction of a metallic compound represented by the following formula (I):

$$(R^0)_n M^0 (Y)_{z-n} \quad \text{(I)}$$

wherein $R^0$ represents a hydrogen atoms, a hydrocarbon group or a heterocyclic group; Y represents a reactive group; $M^0$ represents a metal atom having a valence of from 3 to 6; z represents a valence of the metal atom $M^0$; and n represents 0, 1, 2, 3 or 4, provided that the balance of z−n is not less than 2.

The hydrolysis polymerization condensation reaction is a reaction wherein the reactive group is repeatedly subjected to hydrolysis and condensation under an acidic or basic condition to conduct polymerization. The metallic compounds can be used individually or as a mixture of two or more thereof for the preparation of the metal-containing resin.

Now, the metallic compound represented by formula (I) will be described in more detail below.

In formula (I), $R^0$ preferably represents a straight chain or branched chain alkyl group having from 1 to 12 carbon atoms (e.g., methyl, ethyl, propyl, butyl, pentyl, hexyl, heptyl, octyl, nonyl, decyl or dodecyl group) which may have one or more substituents including, for example, a halogen atom (e.g., chlorine, fluorine or bromine atom), a hydroxy group, a thiol group, a carboxy group, a sulfo group, a cyano group, an epoxy group, an —OR' group (wherein R' represents a hydrocarbon group, e.g., methyl, ethyl, propyl, butyl, hexyl, heptyl, octyl, decyl, propenyl, butenyl, hexenyl, octenyl, 2-hydroxyethyl, 3-chloropropyl, 2-cyanoethyl, N,N-dimethylaminoethyl, 2-bromoethyl, 2-(2-methoxyethyl)oxyethyl, 2-methoxycarbonylethyl, 3-carboxypropyl or benzyl group), an —OCOR' group, a —COOR' group, a —COR' group, an —$N(R'')_2$ group (wherein two R"s, which may be the same or different, each represents a hydrogen atom or a group having the same meaning as defined for R'), an —NHCONHR' group, an —NHCOOR' group, an —$Si(R')_3$ group, a —CONHR" group or an —NHCOR' group; a straight chain or branched chain alkenyl group having from 2 to 12 carbon atoms (e.g., vinyl, propenyl, butenyl, pentenyl, hexenyl, octenyl, decenyl or dodecenyl group) which may have one or more substituents selected from those described for the above-described alkyl group; an aralkyl group having from 7 to 14 carbon atoms (e.g., benzyl, phenetyl, 3-phenylpropyl, naphthylmethyl or 2-naphthylethyl group) which may have one ore more substituents selected from those described for the above-described alkyl group; an alicyclic group having from 5 to 10 carbon atoms (e.g., cyclopentyl, cyclohexyl, 2-cyclohexylethyl, 2-cyclopentylethyl, norbornyl or adamantly group) which may have one or more substituents selected from those described for the above-described alkyl group; an aryl group having from 6 to 12 carbon atoms (e.g., phenyl or naphthyl group) which may have one or more substituents selected from those described for the above-described alkyl group; or a heterocyclic group containing at least one atom selected from a nitrogen atom, an oxygen atom and a sulfur atom (examples of the hetero ring including pyran, furan, thiophene, morpholine, pyrrole, thiazole, oxazole, pyridine, piperidine, pyrrolidone, benzothiazole, benzoxazole, quinoline or tetrahydrofuran ring), which may have a condensed ring and which may have one or more substituents selected from those described for the above-described alkyl group.

The reactive group represented by Y in formula (I) preferably includes a hydroxy group, a halogen atom (e.g., fluorine, chlorine, bromine or iodine atom), an —$OR^1$ group, an —$OCOR^2$ group, a —$CH(COR^3)$ $(COR^4)$ group, a —$CH(COR^3)$ $(COOR^4)$ group or an —$N(R^5)$ $(R^6)$ group.

In the —$OR^1$ group, $R^1$ represents an aliphatic group having from 1 to 10 carbon atoms which may be substituted (e.g., methyl, ethyl, propyl, butyl, pentyl, hexyl, heptyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxy)ethyl, 2-(N,N-diethylamino)ethyl, 2-methoxypropyl, 2-cyanoethyl, 3-methyloxypropyl, 2-chloroethyl, cyclohexyl, cyclopentyl, cyclooctyl, chlorocyclohexyl, methoxycyclohexyl, benzyl, phenetyl, dimethoxybenzyl, methylbenzyl or bromobenzyl group).

In the —$OCOR^2$ group, $R^2$ represents an aliphatic group having the same meaning as defined for $R^1$ or an aromatic group having from 6 to 12 carbon atoms which may be substituted (e.g., an aryl group having the same meaning as defined for $R^0$ described above.

In the —$CH(COR^3)$ $(COR^4)$ group and the —$CH(COR^3)$ $(COOR^4)$ group, $R^3$ represents an alkyl group having from 1 to 4 carbon atoms (e.g., methyl, ethyl, propyl or butyl group) or an aryl group (e.g., phenyl, tolyl or xylyl group); and $R^4$ represents an alkyl group having from 1 to 6 carbon atoms (e.g., methyl, ethyl, propyl, butyl, pentyl or hexyl group), an aralkyl group having from 7 to 12 carbon atoms (e.g., benzyl, phenetyl, phenylpropyl, methylbenzyl, methoxybenzyl, carboxybenzyl or chlorobenzyl group) or an aryl group (e.g., phenyl, tolyl, xylyl, mesityl, methoxyphenyl, chlorophenyl, carboxyphenyl or diethoxyphenyl group).

In the —$N(R^5)$ $(R^6)$ group, $R^5$ and $R^6$, which may be the same or different, each represents a hydrogen atom or an aliphatic group having from 1 to 10 carbon atoms which may be substituted (e.g., an aliphatic group having the same meaning as defined for $R^1$ in the above-described —$OR^1$ group). More preferably, the total number of carbon atoms contained in $R^5$ and $R^6$ are 12 or less.

The metal atom represented by $M^0$ in formula (I) includes preferably metal atoms of transition metals, rare earth metals and metals of III to V groups of the periodic table. More preferred metal atoms include Al, Si, Sn, Ge, Ti and Zr, and still more preferred metal atoms include Al, Si, Sn, Ti and Zr. Particularly, Si is preferred.

Specific examples of the metallic compound represented by formula (I) are set forth below, but the present invention should not be construed as being limited thereto.

Methyltrichlorosilane, methyltribromosilane, methyltrimethoxysilane, methyltriethoxysilane, methyltriisopropoxysilane, methyltri(tert-butoxy)silane, ethyltrichlorosilane, ethyltribromosilane, ethyltrimethoxysilane, ethyltriethoxysilane, ethyltriisopropoxysilane, ethyltri-(tert-butoxy)silane, n-propyltrichlorosilane, n-propyltribromosilane, n-propyltrimethoxysilane, n-propyl-triethoxysilane, n-propyltriisopropoxysilane, n-propyltri-(tert-butoxy)silane, n-hexyltrichlorosilane, n-hexyltri-bromosilane, n-hexyltrimethoxysilane, n-hexyltriethoxy-silane, n-hexyltriisopropoxysilane, n-hexyltri(tert-butoxy)silane, n-decyltrichlorosilane, n-decyltribromo-silane, n-decyltrimethoxysilane, n-decyltriethoxysilane, n-decyltriisopropoxysilane, n-decyltri(tert-butoxysilane), n-octadecyltrichlorosilane, n-octadecyltribromosilane, n-octadecyltrimethoxysilane, n-octadecyltriethoxysilane, n-octadecyltriisopropoxysilane, n-octadecyltri(tert-butoxy)-silane, phenyltrichlorosilane, phenyltribromosilane, phenyltrimethoxysilane, phenyltriethoxysilane, phenyltriisopropoxysilane, phenyltri (tert-butoxy)silane, tetra-chlorosilane, tetrabromosilane, tetramethoxysilane, tetra-ethoxysilane, tetraisopropoxysilane, tetrabutoxysilane, dimethoxydiethoxysilane, dimethyldichlorosilane, dimethyldibromosilane, dimethyldimethoxysilane, dimethyldiethoxy-silane, diphenyldichlorosilane, diphenyldibromosilane, diphenyldimethoxysilane, diphenyldiethoxysilane, phenyl-methyldichlorosilane, phenylmethyldibromosilane, phenylmethyldimethoxysilane, phenylmethyldiethoxysilane, triethoxyhydrosilane, tribromohydrosilane, trimethoxyhydrosilane, triisopropoxyhydrosilane, tri(tert-butoxy)-hydrosilane, vinyltrichlorosilane, vinyltribromosilane, vinyltrimethoxysilane, vinyltriethoxysilane, vinyltriisopropoxysilane, vinyltri(tert-butoxy)silane, trifluoro-propyltrichlorosilane, trifluoropropyltribromosilane, trifluoropropyltrimethoxysilane, trifluoropropyltriethoxysilane, trifluoropropyltriisopropoxysilane, trifluoropropyltri(tert-butoxy)silane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri(tert-butoxy)silane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri(tert-butoxy)silane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri(tert-butoxy)silane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-(tert-butoxy)silane, β-(3,4-epoxycyclohexyl) ethyltrimethoxysilane, β-(3,4-epoxycyclohexyl) ethyltriethoxysilane, $Ti(OR)_4$ (wherein R represents an alkyl group, e.g., methyl, ethyl, propyl, butyl, pentyl or hexyl group), $TiCl_4$, $Zn(OR)_2$, $Zn(CH_3COCHCOCH_3)_2$, $Sn(OR)_4$, $Sn(CH_3COCHCOCH_3)_4$, $Sn(OCOR)_4$, $SnCl_4$, $Zr(OR)_4$, $Zr(CH_3COCHCOCH_3)_4$ and $Al(OR)_3$.

Now, the organic polymer for use in the present invention will be described in more detail below.

The organic polymer contains a group capable of forming a hydrogen bond with the metal-containing resin. The group capable of forming a hydrogen bond with the metal-containing resin (hereinafter also referred to as a specific bond-forming group) preferably includes an amido bond (including a carbonamido bond and a sulfonamido bond), a urethane bond, a ureido bond and a hydroxy group.

The organic polymer contains at least one specific bond-forming group in the main chain and/or the side chain thereof as a repeating unit component. The organic polymer preferably includes a polymer containing, as a repeating unit component, a component having at least one bond selected from $—N(R^{11})CO—$, $—N(R^{11})S_2O—$, —NHCONH—and —NHCOO—the main chain or side chain thereof, and a polymer containing, as a repeating unit component, a component having a hydroxy group. In the above-described amido bonds, $R^{11}$represents a hydrogen atom or an organic residue, and the organic residue includes the hydrocarbon group and heterocyclic group represented by $R^0$ in formula (I).

The organic polymer containing the specific bond in its main chain according to the present invention includes an amide resin having the $—N(R^{11})CO—$or $—N(R^{11})SO_2—$ bond, a ureido resin having the —NHCONH—bond and a urethane resin having the —NHCOO—bond.

As diamines and dicarboxylic acids used for preparation of the amide resins, diisocyanates used for preparation of the ureido resins and diols used for preparation of the urethane resins, compounds described, for example, in Kobunshi Gakkai ed., *Kobunshi Data Handbook-Kisohen-(Polymer Data Handbook, Fundamental Volume)*, Chapter I, Baifukan Co., Ltd. (1986), Shinzo Yamashita and Tosuke Kaneko ed., *Kakyozai Handbook* (*Handbook of Cross-linking Agents*), Taiseisha Co., Ltd. (1981).

Other examples of the polymer containing the amido bond include a polymer containing a repeating unit represented by formula (II) shown below, an N-acylated polyalkyleneimine, and polyvinylpyrrolidone and a derivative thereof.

(II)

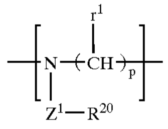

wherein, $Z^1$ represents —CO—, $—SO_2—$or —CS—; $R^{20}$ represents a hydrogen atom, a hydrocarbon group or a heterocyclic group (the hydrocarbon group and heterocyclic group having the same meanings as those defined for $R^0$ in formula (I), respectively); $r^1$ represents hydrogen atom or an alkyl group having from 1 to 6 carbon atoms (e.g., methyl, ethyl, propyl, butyl, pentyl or hexyl group), ris may be the same or different; and p represents an integer of 2 or 3.

Among the polymers containing a repeating unit represented by formula (II), a polymer wherein $Z^1$ represents —CO—and p is 2 can be obtained by ring-opening polymerization of oxazoline which may be substituted in the presence of a catalyst. The catalyst which can be used includes a sulfuric ester or sulfonic ester (e.g., dimethyl sulfate or an alkyl p-toluenesulfonate), an alkyl halide (e.g., an alkyl iodide such as methyl iodide), a fluorinated metallic compound of Friedel-Crafts catalyst, and an acid (e.g., sulfuric acid, hydrogen iodide or p-toluenesulfonic acid) or an oxazolinium salt thereof formed from the acid and oxazoline.

The polymer may be a homopolymer or a copolymer. The polymer also includes a graft polymer containing the units derived from oxazoline in its graft portion.

Specific examples of the oxazoline include 2-oxazoline, 2-methyl-2-oxazoline, 2-ethyl-2-oxazoline, 2-propyl-2-oxazoline, 2-isopropyl-2-oxazoline, 2-butyl-2-oxazoline, 2-dichloromethyl-2-oxazoline, 2-trichloromethyl-2-oxazoline, 2-pentafluoroethyl-2-oxazoline, 2-phenyl-2-oxazoline, 2-methoxycarbonylethyl-2-oxazoline, 2-(4-methylphenyl)-2-oxazoline, and 2-(4-chlorophenyl)-2-oxazoline. Preferred examples of the oxazoline include 2-oxazoline, 2-methyl-2-oxazoline, 2-ethyl-2-oxazoline. The oxazolines may be employed individually or as a mixture of two or more thereof.

Other polymers containing a repeating unit represented by formula (II) are also obtained in the same manner as described above except for using thiazoline, 4,5-dihydro-1,3-oxazine or 4,5-dihydro-1,3-thiazine in place of the oxazoline.

The N-acylated polyalkyleneimine includes a carboxylic amide compound containing an $—N(CO—R^{20})—$bond obtained by a polymer reaction of polyalkyleneimine with a carboxylic halide and a sulfonamide compound containing an $—N(SO_2—R^{20})—$bond obtained by a polymer reaction of polyalkyleneimine with a sulfonyl halide.

The organic polymer containing the specific bond in the side chain thereof according to the present invention includes a polymer containing as the main component, a component having at least one bond selected from the specific bonds.

Specific examples of the component having the specific bond include repeating units derived from acrylamide, methacrylamide, crotonamide and vinyl acetamide, and the repeating units shown below, but the present invention should not be construed as being limited thereto.

(1)

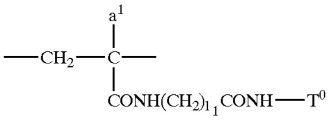

$a^1$: —H or $—CH_3$
$l_1$: an integer of from 1 to 4
$T^0$: —H, $—CH_3$, $—(CH_2)_2OCH_3$ or $—(CH_2)_2N(CH_3)_2$ (2)

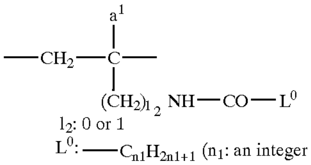

$l_2$: 0 or 1
$L^0$: $—C_{n1}H_{2n1+1}$ ($n_1$: an integer of from 1 to 4), $—(CH_2)_2OCH_3$, $—(CH_2)_3N(CH_3)_2$ $—CH_2C_6H_5$ or $—(CH_2)_{n1}OH$ (3)

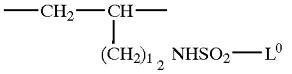

(4)

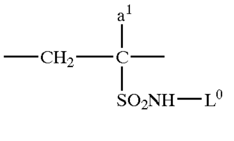

-continued (5)

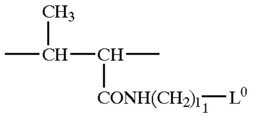

(6)

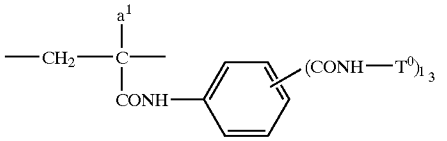

$l_3$: 0, 1 or 2

(7)

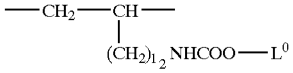

(8)

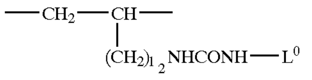

(9)

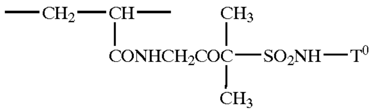

(10)

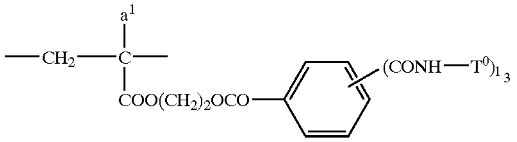

(11)

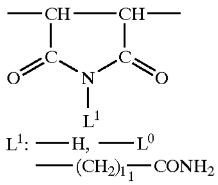

$L^1$: —H, —$L^0$
—$(CH_2)l_1$—$CONH_2$ (12)

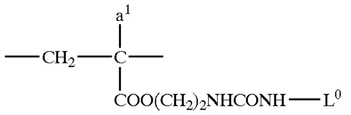

(13)

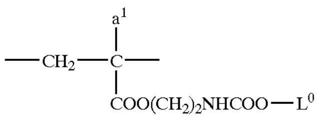

(14)

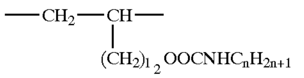

(15)

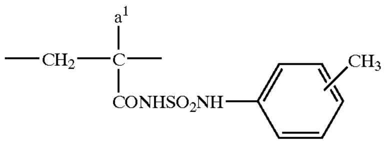

(16)

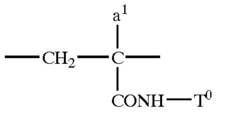

The organic polymer containing a hydroxy group according to the present invention may be any of natural water-soluble polymers, semisynthetic water-soluble polymers and synthetic water-soluble polymers, and include those described, for example, in Munio Kotake supervised, *Daiyuukikagaku* 19-*Tennen Koubunshi Kagoubutsu I* (*Grand Organic Chemistry* 19-*Natural Polymer Compounds I*), Asakura Shoten (1960), Keiei Kaihatsu Center Shuppanbu ed., *Suiyousei Koubunshi●Mizubunsangata Jushi Sougogijutsu Shiryoshu* (*Water-Soluble Polymerse●Aqueous Dispersion Type Resins: Collective Technical Data*), Keiei Kaihatsu Center Shuppanbu (1981), Sinji Nagatomo, *Shin-Suiyousei Polymer no Ouyou to Shijo* (*New Applications and Market of Water-Soluble Polymers*), CMC (1988), and *Kinousei Cellulose no Kaihatsu* (*Development of Functional Cellulose*), CMC (1985).

Specific examples of the natural and semisynthetic water-soluble polymers include cellulose, cellulose derivatives (e.g., cellulose esters such as cellulose nitrate, cellulose sulfate, cellulose acetate, cellulose propionate, cellulose succinate, cellulose butyrate, cellulose acetate succinate, cellulose acetate butyrate or cellulose acetate phthalate, and cellulose ethers such as methylcellulose, ethylcellulose, cyanoethylcellulose, carboxymethylcellulose, hydroxyethylcellulose, hydroxypropylcellulose, ethyl hydroxyethylcellulose, hydroxypropyl methylcellulose or carboxymethyl hydroxyethylcellulose), starch, starch derivatives (e.g., oxidized starch, esterified starch including those esterified with an acid such as nitric acid, sulfuric acid, phosphoric acid, acetic acid, propionic acid, butyric acid or succinic acid, and etherified starch such as methylated starch, ethylated starch, cyanoethylated starch, hydroxyalkylated starch or carboxymethylated starch), alginic acid, pectin, carrageenan, tamarind gum, natural rubber (e.g., gum arabic, guar gum, locust bean gum, tragacanth gum or xanthane gum), pullulan, dextran, casein, gelatin, chitin and chitosan.

Specific examples of the synthetic water-soluble polymer include polyvinyl alcohol, polyalkylene glycols (e.g., polyethylene glycol, polypropylene glycol or ethylene glycol/propylene glycol copolymers), allyl alcohol copolymers, homopolymers or copolymers of acrylate or methacrylate containing at least one hydroxy group (examples of the ester portion including 2-hydroxyethyl, 3-hydroxypropyl, 2,3-dihydroxypropyl, 3-hydroxy-2-hydroxy-methyl-2-methylpropyl, 3-hydroxy-2,2-di(hydroxymethyl)-propyl, polyoxyethylene and polyoxypropylene groups), homopolymers or copolymers of N-substituted acrylamide or methacrylamide containing at least one hydroxy group (examples of the N-substituent including monomethylol, 2-hydroxyethyl, 3-hydroxypropyl, 1,1-bis(hydroxymethyl) ethyl and 2,3,4,5,6-pentahydroxypentyl groups). However, the synthetic water-soluble polymer is not particularly limited as long as it contains at least one hydroxy group in the side chain substituent of the repeating unit thereof.

The organic polymers according to the present invention may be used individually or as a mixture of two or more thereof.

The weight average molecular weight of the organic polymer constituting the complex for use in the image-receiving layer according to the present invention is preferably from $1\times10^3$ to $1\times10^6$, more preferably from $5\times10^3$ to $4\times10^5$.

In the complex comprising the metal-containing resin and the organic polymer according to the present invention, a ratio of the metal-containing resin to the organic polymer can be varied over a wide range, and a weight ratio of metal-containing resin/organic polymer is preferably from 10/90 to 90/10, more preferably from 20/80 to 80/20. At a rate in such a range, the film-strength and water-resistance of the image-receiving d layer to dampening water during printing are advantageously effected.

The binder resin comprising the complex of organic polymer and inorganic polymer according to the present invention forms a uniform organic/inorganic hybrid by means of the function of hydrogen bonds formed between hydroxy groups of the metal-containing resin produced by the hydrolysis polymerization condensation of the metallic compounds as described above and the above described specific bond-forming groups in the organic polymer and is microscopically homogeneous without the occurrence of phase separation to well maintain affinity between the metal-containing resin and the organic polymer. Also, it is believed that the affinity between the metal-containing resin and the organic polymer is more improved due to the function of the hydrocarbon group included in the metal-containing resin. Further, the complex of the metal-containing resin and the organic polymer is excellent in a film-forming property.

The complex comprising the metal-containing resin and the organic polymer can be prepared by subjecting the metallic compound to the hydrolysis polymerization condensation and then mixing with the organic polymer, or by conducting the hydrolysis polymerization condensation of the metallic compound in the presence of the organic polymer.

Preferably, the complex of organic polymer and inorganic polymer according to the present invention is prepared by conducting the hydrolysis polymerization condensation of the metallic compound in the presence of the organic polymer according to a sol-gel method. In the complex of organic polymer and inorganic polymer thus prepared, the organic polymer is uniformly dispersed in a matrix (i.e., three-dimensional micro-network structure of inorganic metallic oxide) of gel prepared by the hydrolysis polymerization condensation of the metallic compound.

The sol-gel method in the present invention may be performed according to any of conventionally well-known sol-gel methods. More specifically, it is conducted with reference to methods described in detail, for example, *in Sol-Gel-ho niyoru Hakumaku Coating Gijutsu* (*Thin Film Coating Technology by Sol-Gel Method*), Gijutsujoho Kyokai (1995), Sumio Sakibana, *Sol-Gel-ho no Kagaku* (*Science of Sol-Gel Method*), Agne Shofusha (1988), and Seki Hirashima, *Saishin Sol-Gel-ho niyoru Kinosei Hakumaku Sakusei Gijutsu* (*Latest Technology of Functional Thin Film Formation by Sol-Gel Method*), Sogo Gijutu Center (1992).

In a coating solution for the image-receiving layer, an aqueous solvent is preferably used. A water-soluble solvent is also employed together therewith in order to prevent the occurrence of precipitation during the preparation of coating solution, thereby forming a homogenous solution. Examples of the water-soluble solvent include an alcohol (such as methanol, ethanol, propyl alcohol, ethylene glycol, diethylene glycol, propylene glycol, dipropylene glycol, ethylene glycol monomethyl ether, propylene glycol monomethyl ether or ethylene glycol monoethyl ether), an ether (such as tetrahydrofuran, ethylene glycol dimethyl ether, propylene glycol dimethyl ether or tetrahydropyran), a ketone (such as acetone, methyl ethyl ketone or acetylacetone), an ester (such as methyl acetate or ethylene glycol monoacetate) and an amide (such as formamide, N-methylformamide, pyrrolidone or N-methylpyrrolidone). These solvents may be used individually or as a mixture of two or more thereof.

It is preferable to also use an acidic or basic catalyst for the purpose of accelerating the hydrolysis and polymerization condensation reaction of the metallic compound represented by formula (I).

The catalyst used for the above purpose is an acidic or basic compound itself or an acidic or basic compound dissolved in a solvent such as water or an alcohol (hereinafter referred to as an acidic catalyst or a basic catalyst, respectively). The concentration of catalyst is not particularly limited, and the high catalyst concentration tends to increase the hydrolysis speed and the polymerization condensation speed. However, since the basic catalyst used in a high concentration may cause precipitation in the sol solution, it is desirable that the basic catalyst concentration be not higher than 1N (mole/liter), as the concentration in the aqueous solution.

The acidic catalyst or the basic catalyst used has no particular restriction as to the species. In a case where the use of a catalyst in a high concentration is required, however, a catalyst constituted of elements which leave no residue in crystal grains obtained after sintering is preferred. Suitable examples of the acidic catalyst include a hydrogen halide (e.g., hydrogen chloride), nitric acid, sulfuric acid, sulfurous acid, hydrogen sulfide, perchloric acid, hydrogen peroxide, carbonic acid, a carboxylic acid (e.g., formic acid or acetic acid), a substituted carboxylic acid (e.g., an acid represented by formula of RCOOH wherein R is an element or a substituent other than H— and $CH_3$—), and a sulfonic acid (e.g., benzenesulfonic acid). Suitable examples of the basic catalyst include an ammoniacal base (e.g., aqueous ammonia) and an amine (e.g., ethylamine or aniline).

The coating solution for the image-receiving layer is coated on a water-resistant support using any of conventionally known coating methods, and dried to form the image-receiving layer.

The thickness of the image-receiving layer thus formed is preferably from 0.2 to 10 $\mu$m, more preferably from 0.5 to 8 $\mu$m. At a thickness in such a range, the layer formed can have a uniform thickness and sufficient film-strength.

The image-receiving layer according to the present invention preferably has a surface smoothness of not less than 30 (sec/10 ml) in terms of a Bekk smoothness.

The term "Bekk smoothness" as used herein means a Bekk smoothness degree measured by a Bekk smoothness tester. In the Bekk smoothness tester, a sample piece is pressed against a circular glass plate having a surface of highly smooth finish and a hole at the center while applying thereto a definite pressure (1 kg/$cm^2$), and a definite volume (10 ml) of air is forced to pass between the sample piece and the glass surface under reduced pressure. Under this condition, a time (expressed in second) required for the air passage is measured.

In a case of plate-making where images are formed on the lithographic printing plate precursor by means of an electrophotographic printer, an appropriate range of the Bekk smoothness depends on whether toner used in the electrophotographic printer is dry toner or liquid toner.

More specifically, in the case of using dry toner in the electrophotographic printer, it is desirable that the Bekk smoothness of the image-receiving layer surface be preferably from 30 to 200 (sec/10 ml), more preferably from 50 to 150 (sec/10 ml). At a smoothness in such a range, the undesirable attachment of scattered toner to the non-image area (occurrence of background stain) is prevented and the toner adheres uniformly and firmly to the image area in the process of transferring and fixing the toner image to the printing plate precursor, whereby satisfactory reproduction of fine lines and fine letters and uniformity in the solid image area can be achieved.

In the case of using liquid toner in the electrophotographic printer, it is desirable for the image-receiving layer surface to have the Bekk smoothness of not less than 30 (sec/10 ml), and the toner images transferred and fixed thereto can have better quality the higher the Bekk smoothness is. Specifically, the range thereof is preferably from 150 to 3,000 (sec/10 ml), more preferably from 200 to 2,500 (sec/10 ml).

In a case where images are formed by means of an ink jet printer or a thermal transfer printer, the Bekk smoothness of the lithographic printing plate precursor surface is preferably in the range described above for the case of using liquid developer in the electrophotographic printer.

At a smoothness in such a range, highly accurate toner images such as fine lines, fine letters or dots can be transferred faithfully to the image-receiving layer, and fixed thereto so firmly as to ensure sufficient strength in the image area.

It is more preferred that the surface of the image-receiving layer has high and dense unevenness. More specifically, the image-receiving layer preferably has an average surface center roughness (SRa) defined in ISO-468 in the range of from 1.3 to 3.5 μm, and an average wavelength (Sλa), which indicates the density of the surface roughness, of not more than 50 μm. More preferably, the SRa is in the range of from 1.35 to 2.5 μm, and the Sλa is not more than 45 μm. It is believed that the adhesion of scattered toner to the non-image area after plate-making by electrophotography and spreading of adhered toner during fixing can be prevented owing to the use of the image-receiving layer having the above described surface unevenness.

Now, the water-resistant support which can be used in the present invention will be described in more detail below.

Examples of the water-resistant support used include an aluminum plate, a zinc plate, a bimetal plate such as a copper-aluminum plate, a copper-stainless steel plate or a chromium-copper plate, and a trimetal plate such as a chromium-copper-aluminum plate, chromium-lead-iron plate or a chromium-copper-stainless steel plate, which each has a thickness of preferably from 0.1 to 3 mm, more preferably from 0.1 to 1 mm. Also, paper subjected to water-resistant treatment, paper laminated with a plastic film or a metal foil, and a plastic film each preferably having a thickness of from 80 to 200 μm are employed.

The water-resistant support has preferably a highly smooth surface. Specifically, it is desirable for the support used in the present invention that the Bekk smoothness on the surface side which is contact with the image-receiving layer be adjusted to preferably at least 300 (sec/10 ml), more preferably from 900 to 3,000 (sec/10 ml), still more preferably from 1,000 to 3,000 (sec/10 ml).

By controlling the Bekk smoothness of the surface side of the support which is contact with the image-receiving layer to at least 300 sec/10 ml, the image reproducibility and the printing durability can be more improved. As such improving effects can be obtained even when the image-receiving layer provided thereon has the same surface smoothness, the increase in the smoothness of the support surface is considered to improve the adhesion between the image area and the image-receiving layer.

The Bekk smoothness of the surface of the support can be measured in the same manner as described with respect to the image-receiving layer.

The expression "highly smooth surface of the water-resistant support" as used herein means a surface coated directly with the image-receiving layer. In other words, when the support has a conductive layer, an under layer or an overcoat layer as described below, the highly smooth surface denotes the surface of the conductive layer, under layer or overcoat layer.

Thus, the surface condition of the image-receiving layer can be controlled and fully kept without receiving the influence of surface roughness of the support used. As a result, it becomes possible to further improve the image quality.

The adjustment of the surface smoothness to the above described range can be made using various well-known methods. For instance, the Bekk smoothness of support surface can be adjusted by coating a substrate with a resin using a melt adhesion method, or by using a strengthened calender method utilizing highly smooth heated rollers.

The lithographic printing plate precursor according to the present invention can be preferably used as a printing plate precursor for forming images on the image-receiving layer provided on the water-resistant support with an electrophotographic recording system or an electrostatic ejection type ink jet recording system wherein oil-based ink is ejected utilizing an electrostatic field. The lithographic printing plate thus-prepared can provide a great number of printed matters having clear images.

In the case of utilizing the electrophotographic recording system to form images, transfer of toner images to a material to be transferred in the electrophotographic process is usually carried out electrostatically. In the above case, it is preferred that the water-resistant support of the lithographic printing plate precursor is electrically conductive. Specifically, the specific electric resistance of the water-resistant support is preferably from $10^4$ to $10^{13}$ Ω·cm, more preferably from $10^7$ to $10^{12}$ Ω·cm. By adjusting the specific electric resistance to the above described range, blur and distortion of the transferred image and stain due to adhesion of toner to the non-image area can be restrained to a practically acceptable extent, so that the images of good quality can be obtained.

It is desirable for the water-resistant support used in the electrostatic ejection type ink jet recording system to have electric conductivity. At least in the part just under the image-receiving layer, the support has the specific electric resistance of preferably not more than $10^{10}$ Ω·cm. For the water-resistant support as a whole, the specific electric resistance is preferably $10^{10}$ Ω·cm or below, and more preferably $10^8$ Ω·cm or below. The value may be infinitely close to zero.

In the above described range of electric conductivity, the charged ink droplets just after attaching to the image-receiving layer can quickly lose their electric charge through earth. Thus, clear images free from disorder can be formed.

The specific electric resistance (also referred to as volume specific electric resistance or specific resistivity, sometimes) is measured by a three-terminal method with a guard electrode according to the method described in JIS K-6911.

The electric conductivity as described above can be conferred on the support in the part just under the image-receiving layer, e.g., by coating a substrate such as paper or a film with a layer comprising an electrically conductive filler such as carbon black and a binder, by sticking a metal foil on a substrate, or by vapor-depositing metal onto a substrate.

On the other hand, examples of the support that is electrically conductive as the whole include electrically conductive paper impregnated with sodium chloride, a plastic film in which an electrically conductive filler such as carbon black is mixed, and a metal plate such as an aluminum plate.

Such a support can be prepared by using as a substrate a conductive base paper, for example, paper impregnated with sodium chloride, and providing a conductive water-resistant layer on both sides of the substrate. Examples of paper which can be used for preparing the conductive base paper include wood pulp paper, synthetic pulp paper, and paper made from a mixture of wood pulp and synthetic pulp. It is preferred for such paper to have a thickness of 80 to 200 μm.

The formation of the conductive layer can be performed by applying a layer containing a conductive filler and a binder on the both sides of the conductive paper. The thickness of each of the conductive layer applied is preferably from 5 to 20 μm.

Examples of the conductive filler usable include granular carbon black or graphite, metal powder such as silver, copper, nickel, brass, aluminum, steel or stainless steel powder, tin oxide powder, flaky aluminum or nickel, and fibrous carbon.

The binder can be appropriately selected from various kinds of resins. Examples of a resin suitable for the binder include hydrophobic resins, for example, acrylic resins, vinyl chloride resins, styrene resins, styrene-butadiene resins, styrene-acrylic resins, urethane resins, vinylidene chloride resins and vinyl acetate resins, and hydrophilic resins, for example, polyvinyl alcohol resins, cellulose derivatives, starch and derivatives thereof, polyacrylamide resins and copolymers of styrene and maleic anhydride.

Another method for forming the conductive layer is to laminate a conductive thin film. Examples of such a conductive thin film usable include a metallic foil and a conductive plastic film. More specifically, an aluminum foil can be used for the metallic foil, and a polyethylene resin film in which carbon black is incorporated can be used for the conductive plastic film. Both hard and soft aluminum foils can be used as the laminating material. The thickness of the conductive thin film is preferably from 5 to 20 μm.

For the lamination of a polyethylene resin in which carbon black is incorporated, it is preferred to adopt an extrusion lamination method. The extrusion lamination method includes the steps of melting the polyethylene resin by heating, forming the molten resin into a film, pressing the film immediately against the base paper and the cooling them, and can be carried out with various well-known apparatuses. The thickness of the laminated layer is preferably from 10 to 30 μm. As the support having conductivity as a whole, a conductive plastic film and a metal plate can be used as they are as far as they have a satisfactory water-resistant property.

The conductive plastic film includes, e.g., a polypropylene or polyester film in which a conductive filler such as carbon fiber or carbon black is incorporated, and the metal plate includes, e.g., an aluminum plate. The thickness of a substrate is preferably from 80 to 200 μm. If the substrate has a thickness of less than 80 μm, it may not ensure sufficient strength when used as a printing plate. On the other hand, when the thickness of the substrate is more than 200 μm, the handling property such as transportability in a recording apparatus may tend to decrease.

The support having a conductive layer provided on one side or both sides of the water-resistant substrate is described below.

As the water-resistant substrate, paper subjected to water-resistant treatment, paper laminated with a plastic film or a metal foil and a plastic film each preferably having a thickness of from 80 to 200 μm can be used.

As a method for forming a conductive layer on the substrate, the same methods as described in the case where the whole of the support is conductive, can be used. More specifically, the composition containing a conductive filler and a binder is coated on one side of the substrate to form a layer having a thickness of from 5 to 20 μm. Also, the conductive layer is formed by laminating a metal foil or a conductive plastic film on the substrate.

Another method which may be employed comprises depositing a metal film such as an aluminum, tin, palladium or gold film onto a plastic film.

Thus, the water-resistant support having the electrically conductive property can be obtained.

For preventing the printing plate precursor from curling, the support may have a backcoat layer (backing layer) on the side opposite to the image receiving layer. It is preferred that the backcoat layer has the Bekk smoothness of 150 to 700 (sec/10 ml). By providing such a backcoat layer on the support, the printing plate obtained can be mounted with accuracy on an offset printing machine without suffering shear or slippage.

The thickness of the water-resistant support provided with the under layer and/or the backcoat layer is from 90 to 130 μm, more preferably from 100 to 120 μm.

Image formation on the lithographic printing plate precursor for plate-making can be performed by any appropriate method, for example, a thermal transfer recording system, an electrophotographic recording system or an ink jet recording system.

The electrophotographic recording system employed may be any of various well-known recording systems. For instance, the recording systems described, e.g., in Denshishashin Gakkai ed., *Denshishashin Gijutsu no Kiso to Oyo* (*The Fundamentals and Applications of Electrophotographic Techniques*), Corona Co. (1988), Ken-ichi Eda, *Denshishashin Gakkai Shi* (*Journal of Electrophotographic Society*), 27, 113 (1988), and Akio Kawamoto, *ibid.*, 33, 149 (1994) and Akio Kawamoto, *ibid.*, 32, 196 (1993); and commercially available PPC duplicating machines can be employed.

A combination of an exposure system in which the exposure is performed by scanning the laser beams based on digital information with a development system using a liquid developer can be adopted as an effective method for image formation, because it enables the formation of highly accurate images. One example utilizing such a combination is illustrated below.

A photosensitive material is positioned on a flat bed by a register pin system, and fixed to the flat bed by undergoing air suction from the back side. Then, the photosensitive material is charged by means of a charging device described, e.g., in the above-described reference, *The Fundamentals and Applications of Electrophotographic Techniques*, p. 212 et seq. Specifically, a corotron or scotron system is ordinarily used for charging. At the time of charging, it is also preferred to control the charging condition so that the surface potential of the photosensitive material is always kept within the intended range through a feedback system based on the information from a means of detecting the potential of the charged photosensitive material. Thereafter, the scanning exposure using a laser-beam source is performed according to, e.g., the method as described in the reference described above, p. 254 et seq.

Then, toner image formation is carried out with a liquid developer. The photosensitive material charged and exposed on the flat bed is detached from the flat bed, and subjected to wet development as described in the reference described above, p. 275 et seq. The exposure has been carried out in a mode corresponding to the toner image development mode. In the case of reversal development, for instance, a negative image, or an image area, is exposed to laser beams, a toner having the same charge polarity as the charged photosensitive material is employed, and the toner is adhered electrically to the exposed area by applying a bias voltage for development. The principle of the process is explained in detail in the reference described above, p. 157 et seq.

For removal of excess developer after development, the photosensitive material is squeezed with a rubber roller, a gap roller or a reverse roller, or subjected to corona squeeze or air squeeze as described at page 283 of the above-described reference. Before such a squeeze treatment, the photosensitive material is preferably rinsed with only a carrier liquid of the liquid developer.

Then, the toner image formed on the photosensitive material is transferred onto the lithographic printing plate precursor according to the present invention directly or via a transfer intermediate, and fixed to the printing plate precursor.

Any of conventionally known ink jet recording systems can be employed for the image formation. However, the use of oil-based ink is desirable because it ensures quick drying and satisfactory fixation of the ink image and less clogging, and the adoption of an electrostatic ejection type ink jet recording system is preferable, because such a system hardly causes blur of image. A solid jet type ink jet recording system using hot-melt ink is also preferably used.

For the ink jet recording system of on-demand type utilizing static electricity, a method called an electrostatically accelerating type ink jet or slit jet as described, for example, in Susumu Ichinose and Yuuji Ooba, *Denshi Tsushin Gakkai Ronbunshi*, Vol. J66-C, No. 1, page 47 (1983) and Tadayoshi Oono and Mamoru Mizuguchi, *Gazo Denshi Gakkaishi*, Vol. 10, No. 3, page 157 (1981) can be employed. Such an ink jet recording method is also described more specifically, for example, in JP-A-56-170, JP-A-56-4467 and JP-A-57-151374.

According to the method, ink is supplied from an ink tank to a slit-shaped ink chamber having many electrodes arranged in inner surface of a slit-shaped ink retaining part and when a high voltage is selectively applied to each electrode, the ink neighboring to the electrode is discharged on a recording paper closely positioned against the slits, thereby conducting recording.

A method which dose not use such a slit-shaped recording head is also used. In JP-A-61-211048, there is described a method in which pores of a film-like ink retainer having plural pores are filled with ink and the ink in the pores is transferred to a recording paper by applying selectively a voltage to the ink using a multi-needle electrode.

For the solid jet type ink jet recording system, commercially available printing systems, for example, Solid Inkjet Platemaker SJ02A (manufactured by Hitachi Koki Co., Ltd.) and MP-1200Pro (manufactured by Dynic Co., Ltd.) are employed.

A method for forming an image on the lithographic printing plate precursor according to the present invention using an ink jet recording system is described in more detail with reference to FIG. 1 to FIG. 3 below.

An apparatus system shown in FIG. 1 comprises an ink jet recording device 1 wherein oil-based ink is used.

As shown in FIG. 1, pattern information of images (figures and letters) to be formed on a lithographic printing plate precursor (also referred to as "master" hereinafter) 2 is first supplied from an information supply source such as a computer 3 to the ink jet recording device 1 using oil-based ink through a transmission means such as a bus 4. A head for ink jet recording 10 of the recording device 1 stores oil-based ink inside. When the master 2 is passed through the ink jet recording device 1, the head 10 ejects minute droplets of the ink onto the master 2 in accordance with the above described information, whereby the ink is attached to the master 2 in the above described pattern. Thus, the image formation on the master 2 (i.e., plate-making) is conducted, whereby the lithographic printing plate precursor having the images thereon is obtained.

Figure 2:
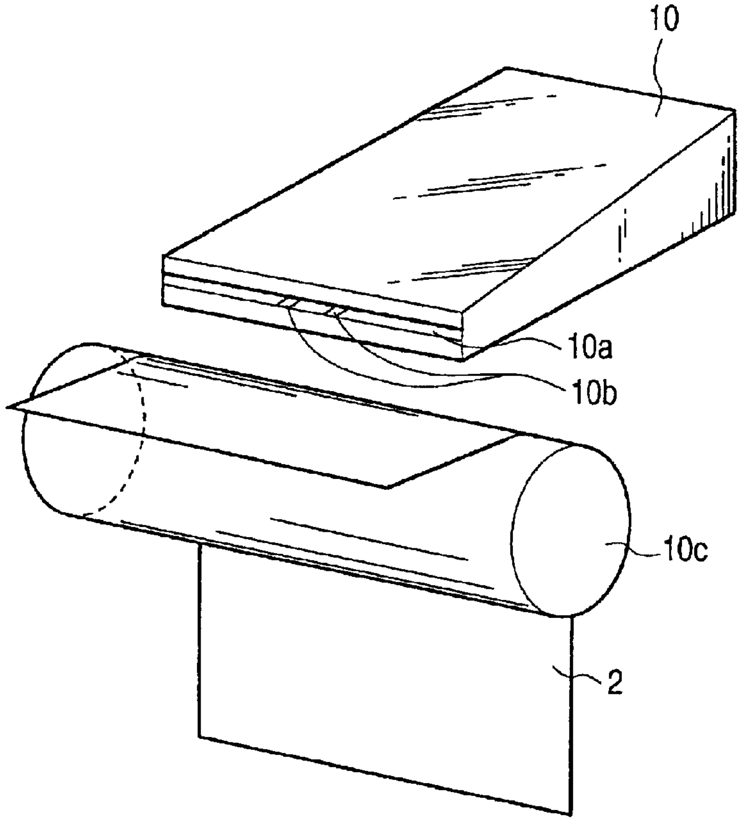
FIG. 2 is a schematic view showing the main part of an ink jet recording device which is utilized for the formation of image on the direct drawing type lithographic printing plate precursor of the present invention.
Figure 3:
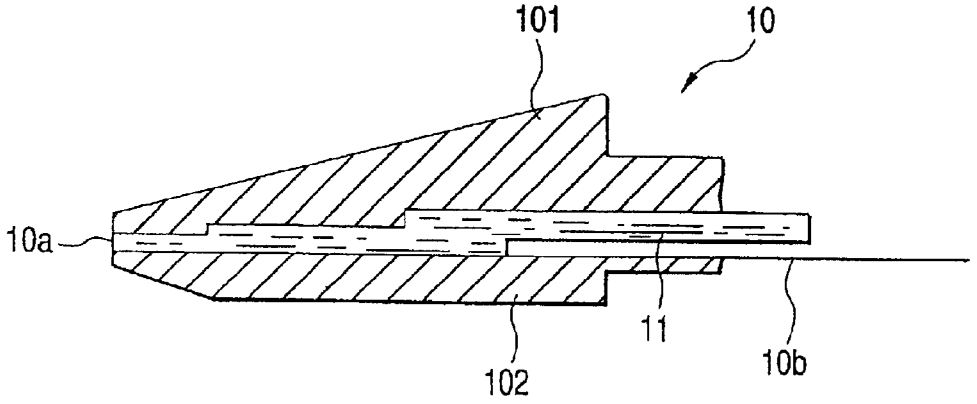
FIG. 3 is a partially cross sectional view of a head of an ink jet recording device which is utilized for the formation of image on the direct drawing type lithographic printing plate precursor of the present invention.

One example of the ink jet recording device as shown in the apparatus system of FIG. 1 is depicted in FIG. 2 and FIG. 3, respectively. In FIG. 2 and FIG. 3, members common to the members in FIG. 1 are designated using the same symbols, respectively.

FIG. 2 is a schematic view showing the main part of the ink jet recording device, and FIG. 3 is a partially cross sectional view of the head.

As shown in FIG. 3, the head 10 installed in the ink jet recording device has a slit between an upper unit 101 and a lower unit 102, a leading edge thereof forms an ejection slit **10*a*. Further, an ejection electrode 10*b* is arranged in the slit, and the interior of the slit is filled with oil-based ink 11**.

To the ejection electrode **10*b* of the head 10, a voltage is applied in accordance with digital signals from the pattern information of image. As shown in FIG. 2, a counter electrode 10*c* is arranged so as to face with the ejection electrode 10*b*, and the master 2 is provided on the counter electrode 10*c*. By the application of the voltage, a circuit is formed between the ejection electrode 10*b* and the counter electrode 10*c*, and the oil-based ink 11 is ejected from the ejection slit 10*a* of the head 10, thereby forming an image on the master 2 provided on the counter electrode 10*c***.

With respect to the width of the ejection electrode **10*b***, it is preferred for the leading edge thereof to be as narrow as possible in order to form an image of high quality.

For instance, print of 40 $\mu$m-dot can be formed on the master 2 by filling the head 10 as shown in FIG. 3 with the oil-based ink, disposing the ejection electrode **10*b* having a leading edge having a width of 20 $\mu$m and the counter electrode 10*c*** so as to face with each other at a distance of 1.5 mm and applying a voltage of 3 KV for 0.1 millisecond between these two electrodes.

The lithographic printing plate precursor having the image formed thereon by the ink jet recording system using the oil-based ink as described above can be used as it is as a lithographic printing plate.

The present invention will be described in greater detail with reference to the following examples, but the present invention should not be construed as being limited thereto.

EXAMPLE 1

<Preparation of Direct Drawing Type Lithographic Printing Plate Precursor>

Composition 1 shown below was dispersed together with glass beads in a paint shaker (manufactured by Toyo Seiki Co., Ltd.) for 10 minutes at room temperature. Then, 33 g of Composition 2 shown below was added thereto and the mixture was further dispersed in the paint shaker for one minute at room temperature. The glass beads were removed by filtration to obtain a coating composition for image-receiving layer.

Composition 1

| | |
|---|---|
| Alumina RK30 (manufactured by Iwatani Chemical Industry Co., Ltd., average particle diameter: 0.6 μm, average pore diameter: 50 angstroms, average specific surface: 300 $m^2/g$) | 31 g |
| 5% By weight aqueous solution of PVA117 (manufactued by Kuraray Co., Ltd.) | 70 g |
| 20% Aqueous solution of colloidal silica* (Snowtex C manufactured by Nissan Chemical Industries, Ltd.) | 60 g |

*not the porous filler of the present invention

Composition 2

| | |
|---|---|
| Tetraethoxysilane | 92 g |
| Ethanol | 163 g |
| Water | 163 g |
| Nitric acid | 0.1 g |

On a support of ELP-2X Type Master (manufactured by Fuji Photo Film Co., Ltd.) having the Bekk smoothness of 2,000 (sec/10 ml) on the under layer side, which is used as an electrophotographic lithographic printing plate precursor for small-scale commercial printing, the coating composition for image-receiving layer prepared above was coated by means of a wire bar and dried in an oven at 100° C. for 10 minutes to form an image-receiving layer having a coating amount of 5 $g/m^2$. Thus, a direct drawing type lithographic printing plate precursor was prepared.

The Bekk smoothness of the surface of the lithographic printing plate precursor measured using a Bekk smoothness tester (manufactured by Kumagai Riko Co., Ltd.) under the condition of the air volume of 10 ml as described hereinbefore was 105 (sec/10 ml). Further, 2 μl of distilled water was put on the surface of the lithographic printing plate precursor, and after a 30-second lapse a contact angle of water with the lithographic printing plate precursor surface was measured with a surface contact angle meter (CA-D manufactured by Kyowa Kaimen Kagaku Co., Ltd.). The value obtained was not more than 5 degrees.

The lithographic printing plate precursor was subjected to plate-making by means of a laser printer (AMSIS 1200-J Plate Setter) with dry toner commercially available as AM-Straight Imaging System.

The duplicated images thus obtained on the printing plate precursor were visually evaluated through a magnifier of 20 magnifications, and it was found that the image quality was good. Specifically, the plate-making image formed by transfer of dry toner from the laser printer had no disappearance of fine lines and fine letters, and uniform solid image area, and unevenness of toner transfer was not observed at all. Although the background stain due to scattering of toner was slightly occurred in the non-image area, it does not cause any trouble in practical use.

The lithographic printing plate precursor was subjected to plate-making in the same manner as described above. The lithographic printing plate thus prepared was then subjected to printing using a full-automatic printing machine (AM-2850 manufactured by AM Co., Ltd.), a solution prepared by diluting a PS plate processing agent (EU-3 manufactured by Fuji Photo Film Co., Ltd.) 50 times with distilled water and supplied in a dampening saucer as dampening water, and a black ink for offset printing. The 10th sheet was picked up in the course of printing, and the printed images thereon were visually evaluated for their image quality (background stain and uniformity in solid image area) through a magnifier of 20 magnifications. The image quality was excellent.

The printing procedure was further performed in the same manner as above. As a result, more than 30,000 sheets of good printed matters were obtained wherein disappearance of fine lines and fine letters and unevenness in solid portion were not observed in the image area and background stain due to adhesion of printing ink did not cause any trouble in practical use.

The lithographic printing plate precursor of the present invention can provide a large number of good printed matters.

COMPARATIVE EXAMPLE 1

A lithographic printing plate precursor was prepared in the same manner as in Example 1 except for using amorphous rutile titanium oxide (manufactured by Wako Pure Chemical Industries, Ltd., average particle diameter: 0.3 μm, average pore diameter: less than one angstrom; average specific surface: 0.001 $m^2/g$) in place of the Alumina RK30 (manufactured by Iwatani Chemical Industry Co., Ltd., average particle diameter: 0.6 μm, average pore diameter: 50 angstroms, average specific surface: 300 $m^2/g$) in the coating composition for image-receiving layer.

The Bekk smoothness of the surface of the lithographic printing plate precursor was 160 (sec/10 ml), and the contact angle of the surface with water was not more than 5 degrees.

The lithographic printing plate precursor was subjected to plate-making and evaluated in the same manner as in Example 1. The quality of images formed on the printing plate precursor was almost same as that of Example 1. Specifically, the images were good and scattering of toner in the non-image area was a little. However, as a result of the printing using the lithographic printing plate thus obtained in the same manner as in Example 1, it was found that the disappearance of image area occurred after printing about 1,000 sheets, although no stain was observed in the non-image area at the beginning of printing.

EXAMPLE 2

<Preparation of Direct Drawing Type Lithographic Printing Plate Precursor>

Composition 3 shown below was dispersed together with glass beads in a paint shaker (manufactured by Toyo Seiki Co., Ltd.) for 10 minutes at room temperature. Then, 33 g of Composition 4 shown below was added thereto and the mixture was further dispersed in the paint shaker for one minute at room temperature. The glass beads were removed by filtration to obtain a coating composition for image-receiving layer.

Composition 3

| | |
|---|---|
| Alumina RK30 (manufactured by Iwatani Chemical Industry Co., Ltd., average particle diameter: 0.6 μm, average pore diameter: 50 angstroms; average specific surface: 300 $m^2/g$) | 20 g |
| Rutile titanium oxide (manufactured by Wako Pure Chemical Industries, Ltd., average particle diameter: 0.3 μm, average pore diameter: less than one angstrom; average specific surface: 0.001 $m^2/g$) | 11 g |
| 5% By weight aqueous solution of PVA117 (manufactured by Kuraray Co., Ltd.) | 70 g |

-continued

| | |
|---|---|
| 20% Aqueous solution of colloidal silica (Snowtex C manufactured by Nissan Chemical Industries, Ltd.) | 60 g |

Composition 4

| | |
|---|---|
| Tetraethoxysilane | 92 g |
| Ethanol | 163 g |
| Water | 163 g |
| Nitric acid | 0.1 g |

On a support of ELP-2X Type Master, the coating composition for image-receiving layer prepared above was coated by means of a wire bar, set to touch and then heated at 110° C. for 30 minutes to form an image receiving layer having a coating amount of 6 $g/m^2$. Thus, a lithographic printing plate precursor was prepared.

The Bekk smoothness of the surface of the lithographic printing plate precursor was 1,000 (sec/10 ml), and the contact angle of the surface with water was not more than 5 degrees.

<Preparation of Electrophotographic Light-Sensitive Element>

A mixture of 2 g of X-type metal-free phthalocyanine (manufactured by Dai-Nippon Ink & Chemicals Inc.), 14.4 g of Binder Resin (P-1) shown below, 3.6 g of Binder Resin (P-2) shown below, 0.15 g of Compound (A) shown below and 80 g of cyclohexanone was placed together with glass beads in a 500 ml of glass vessel, and dispersed for 60 minutes by a paint shaker (manufactured by Toyo Seiki Co., Ltd.). Then, the glass beads were removed by filtration to prepare a dispersion for light-sensitive layer.

Binder Resin (P-1)

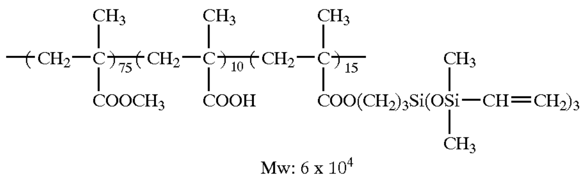

Mw: 6 x $10^4$

Binder Resin (P-2)

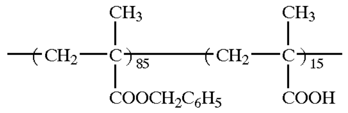

Compound (A)

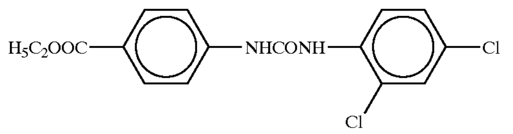

The dispersion for light-sensitive layer thus prepared was coated on a 0.2 mm-thick degreased aluminum plate by means of a wire bar, set to touch, and then heated for 20 seconds in a circulation type oven regulated at 110° C. The resulting light-sensitive layer had a thickness of 8 μm.

The electrophotographic light-sensitive element prepared above was subjected to corona discharge in the dark to have the surface potential of +450 V, and then to scanning-exposure by a semiconductor laser drawing device with a beam having a wavelength of 788 nm as an exposure device. The laser beam scanning was performed on the basis of image information which had been obtained by previously reading an original with a color scanner, subjecting the read image information to color separation, making some corrections relating to color reproduction of the system used, and then memorizing the corrected image information as digital image data in the internal hard disk of the system. As to the laser beam scanning conditions, the beam spot diameter was 15 μm, the pitch was 10 μm and the scanning speed was 300 cm/sec (i.e., 2,500 dpi). The amount of exposure on the light-sensitive element was adjusted to 25 $erg/cm^2$.

Subsequently, the light-sensitive element exposed in the manner described above was developed with a liquid developer shown below, rinsed in a bath of Isopar G alone to remove stain in the non-image area, and dried with a hot air so that the light-sensitive element had a surface temperature of 50° C. and the amount of residual Isopar G was reduced to 10 mg per g of the toner. Then, the light-sensitive element was subjected to −6 KV precharge with a corona charging device, and the image side of the light-sensitive element was brought into face-to-face contact with the lithographic printing plate precursor described above. A negative corona discharge was applied thereto from the side of the light-sensitive element, thereby performing the image transfer.

<Liquid Developer>

The composition shown below were mixed and kneaded for 2 hours at 95° C. by means of a kneader to prepare a mixture. The mixture was cooled inside the kneader, and pulverized therein. One part by weight of the pulverized product and 4 parts by weight of Isopar H were dispersed In a paint shaker for 6 hours to prepare a dispersion. The resulting dispersion was diluted with Isopar G so as to have a solid toner content of 1 g per liter and, as a charge control agent for imparting a negative charge, basic barium petronate was added thereto in an amount of 0.1 g per liter. Thus, a liquid developer was prepared.

(Composition for Kneading)

| | |
|---|---|
| Ethylene-methacrylic acid copolymer (Nucrel N-699 manufactured by Mitsui Du Pont Co.) | 4 parts by weight |
| Carbon Black #30 (manufactured by Mitsubishi Chemical Industries Ltd.) | 1 parts by weight |
| Isopar L (manufactured by Exxon Corp.) | 15 parts by weight |

The lithographic printing plate precursor having the image formed thereon was heated at 100° C. for 30 seconds, thereby fixing completely the toner image.

The images formed on the lithographic printing plate precursor were observed under an optical microscope of 200 magnifications, and the image quality was evaluated. The images obtained were clear and free from blur or disappearance of fine lines and fine letters.

Then, the lithographic printing plate thus prepared was mounted on a printing machine (Oliver Model 94 manufactured by Sakurai Seisakusho Co., Ltd.), and printing was performed on sheets of printing paper using dampening water prepared by diluting SLM-OD (manufactured by Mitsubishi Paper Mills, Ltd.) 100 times with distilled water and supplied in a dampening saucer and black ink for offset printing.

The 10th printed matter was picked up in the course of printing, and the printed images thereon were evaluated by visual observation using a magnifier of 20 magnifications. It was found that the non-image area was free from background stain due to adhesion of the printing ink and the uniformity of the solid image area was good. Further, the printed matter was observed under an optical microscope of 200 magnifications. According to the observation, neither sharpening nor disappearance was found in the area of fine lines and fine letters, and the image quality of printed matter was good.

As a result of continuing the printing procedure, more than 30,000 sheets of printed matters having image quality equal to that of the 10th print were obtained.

EXAMPLE 3

<Preparation of Water-Resistant Support>

Wood free paper having a basis weight of 100 g/$m^2$ was used as a substrate, and a coating composition for backcoat layer shown below was coated on one side of the substrate by means of a wire bar to form a backcoat layer having a dry coating amount of 12 g/$m^2$. Then, the backcoat layer was subjected to a calender treatment so as to have the Bekk smoothness of about 100 (sec/10 ml).

(Coating Composition for Backcoat Layer)

| | |
|---|---|
| Kaolin (50% aqueous dispersion) | 200 parts |
| Polyvinyl alcohol (10% aqueous solution) | 60 parts |
| SBR latex (solid content: 50%, Tg: 0° C.) | 100 parts |
| Melamine resin (solid content: 80%, Sumirez Resin SR-613) | 5 parts |

A coating composition for under layer shown below was coated on the other side of the substrate by means of a wire bar to form an under layer having a dry coating amount of 10 g/$m^2$. Then, the under layer was subjected to a calender treatment so as to have the Bekk smoothness of about 1,500 (sec/10 ml).

(Coating Composition for Under Layer)

| | |
|---|---|
| Carbon black (30% aqueous dispersion) | 5.4 parts |
| Clay (50% aqueous dispersion) | 54.6 parts |
| SBR latex (solid content: 50%, Tg: 25° C.) | 36 parts |
| Melamine resin (solid content: 80%, Sumirez Resin SR-613) | 4 parts |

The composition described above was mixed and water was added thereto so as to have a total solid concentration of 25% to prepare the coating composition for under layer.

The measurement of specific electric resistance of the under layer was carried out in the following manner.

The coating composition for the under layer was applied to a thoroughly degreased and cleaned stainless steel plate at a dry coating amount of 10 g/$m^2$ to form a coating film. The thus formed coating film was examined for specific electric resistance using a three-terminal method with a guard electrode according to the method described in JIS K-6911. The value obtained was $4\times10^9$ Ω·cm.

<Preparation of Direct Drawing Type Lithographic Printing Plate Precursor>

Composition 5 shown below was dispersed together with glass beads in a paint shaker (manufactured by Toyo Seiki Co., Ltd.) for 10 minutes at room temperature. Then, 33 g of Composition 6 shown below was added thereto and the mixture was further dispersed in the paint shaker for one minute at room temperature. The glass beads were removed by filtration to obtain a coating composition for image-receiving layer.

Composition 5

| | |
|---|---|
| Aluminum hydroxide RH30 (manufactured by Iwatani Chemical Industry Co., Ltd., average particle diameter: 1.5 μm, average pore diameter: 100 angstroms, average specific surface: 50 $m^2$/g) | 31 g |
| 5% By weight aqueous solution of PVA117 (manufactured by Kuraray Co., Ltd.) | 70 g |
| 20% Aqueous solution of colloidal silica (Snowtex C manufactured by Nissan Chemical Industries, Ltd.) | 60 g |

Composition 6

| | |
|---|---|
| Tetraethoxysilane | 92 g |
| Ethanol | 163 g |
| Water | 163 g |
| Nitric acid | 0.1 g |

The coating composition for image-receiving layer thus prepared was coated on the water-resistant support described above by means of a wire bar and dried in an oven at 100° C. for 20 minutes to form an image-receiving layer having a coating amount of 6 g/$m^2$. Thus, a lithographic printing plate precursor was prepared.

>Preparation of Oil-Based Ink (IK-1)>

(Production of Resin Particle)

A mixed solution of 14 g of poly(dodecyl methacrylate), 100 g of vinyl acetate, 4.0 g of octadecyl methacrylate and 286 g of Isopar H was heated to temperature of 70° C. under nitrogen gas stream with stirring. To the solution was added 1.5 g of 2,2'-azobis(isovaleronitrile) (abbreviated as AIVN) as a polymerization initiator, followed by reacting for 4 hours. Then, 0.8 g of 2,2'-azobis(isobutyronitrile) (abbreviated as AIBN) was added to the reaction mixture and the mixture was heated to temperature of 80° C., followed by reacting for 2 hours. Further, 0.6 g of AIBN was added to the reaction mixture, followed by reacting for 2 hours. Then, the temperature of the reaction mixture was raised to 100° C., followed by stirring for one hour, thereby distilling off the unreacted monomers. After cooling the reaction mixture, it was passed through a nylon cloth of 200 mesh. The resulting white dispersion was a latex having a polymerization rate of 93% and an average particle size of 0.35 μm. The particle size was measured by CAPA-500 (manufactured by Horiba Ltd.).

(Preparation of Ink)

Ten grams of dodecyl methacrylate/acrylic acid copolymer (copolymerization ratio: 98/2 by weight), 10 g of Alkali Blue and 30 g of Shellsol 71 were placed in a paint shaker (manufactured by Toyo Seiki Co., Ltd.) together with glass beads and dispersed for 4 hours to obtain a blue-colored fine dispersion of Alkali Blue.

Fifty grams (as a solid basis) of the resin particles described above, 5 g (as a solid basis) of the above-described Alkali Blue dispersion and 0.06 g of zirconium naphthenate were diluted with one liter of Isopar G, thereby preparing blue-colored Oil-Based Ink (IK-1).

A servo plotter (DA 8400 manufactured by Graphtech Co.) able to write in accordance with an output from a personal computer was modified so that an ink ejection head as shown in FIG. 2 was mounted on a pen plotter section, and the lithographic printing plate precursor described above was placed on a counter electrode positioned at a distance of 1.5 mm from the ink ejection head. Ink jet printing was performed on the lithographic printing plate precursor using Oil-Based Ink (IK-1) described above to conduct image formation. During the plate-making, the under layer provided just under the image-receiving layer of the printing plate precursor was connected electrically to the counter electrode by silver paste.

Then, the printing plate precursor having the ink image thereon was heated by means of a Ricoh Fuser (manufactured by Ricoh Co., Ltd.) so as to control the surface temperature of the printing plate precursor to 70° C. for 10 seconds, thereby fixing the ink image.

The images formed on the printing plate precursor were visually evaluated under an optical microscope of 200 magnifications. It was found that the images were clear and neither blur nor disappearance of fine lines and fine letters was observed.

Then, the lithographic printing plate thus prepared was mounted on a printing machine (Oliver Model 94 manufactured by Sakurai Seisakusho Co., Ltd.), and printing was performed on sheets of printing paper using dampening water prepared by diluting EU-3 (manufactured by Fuji Photo Film Co., Ltd.) 100 times with distilled water and supplied in a dampening saucer and black ink for offset printing.

The 10th printed matter was picked up in the course of printing, and the printed images thereon were evaluated by visual observation using a magnifier of 20 magnifications. It was found that the non-image area was free from background stain due to adhesion of the printing ink and the uniformity of the solid image area was good. Further, the printed matter was observed under an optical microscope of 200 magnifications. According to the observation, neither sharpening nor disappearance was found in the area of fine lines and fine letters, and the image quality of printed matter was good.

As a result of continuing the printing procedure, more than 30,000 sheets of printed matters having image quality equal to that of the 10th printed matter were obtained.

EXAMPLES 4 TO 17

Lithographic printing plate precursors were prepared in the same manner as in Example 3 except for using each of the compounds shown in Table 1 below in place of aluminum hydroxide RH30 (manufactured by Iwatani Chemical Industry Co., Ltd., average particle diameter: 1.5 μm, average pore diameter: 100 angstroms, average specific surface: 50 $m^2/g$) used as the filler in the image-receiving layer, respectively.

TABLE 1

| Example | Filler |
|---|---|
| Example 4 | Alumina RG30 (manufactured by Iwatani Chemical Industry Co., Ltd., average particle diameter: 0.5 μm, average pore diameter: 100 angstroms, average specific surface: 50 $m^2/g$) |
| Example 5 | Alumina RA30 (manufactured by Iwatani Chemical Industry Co., Ltd., average particle diameter: 1 μm, average pore diameter: 500 angstroms, average specific surface: 50 $m^2/g$) |
| Example 6 | Silica gel (Fineseal X37 manufactured by Tokuyama Corp., average particle diameter: 2.6 μm, average pore diameter: 1,000 angstroms, average specific surface: 300 $m^2/g$) |
| Example 7 | Silica gel (Mizukasil P78A manufactured by Mizusawa Industrial Chemicals Ltd., average particle diameter: 3.5 μm, average pore diameter: 200 angstroms, average specific surface: 400 $m^2/g$) |
| Example 8 | Silica gel (Mizukasil P526 manufactured by Mizusawa Industrial Chemicals Ltd., average particle diameter: 3 μm, average pore diameter: 100 angstroms, average specific surface: 100 $m^2/g$) |
| Example 9 | Silica gel (Sylysia 320 manufactured by Fuji Silysia Chemical Ltd., average particle diameter: 1.6 μm, average pore diameter: 200 angstroms, average specific surface: 300 $m^2/g$) |
| Example 10 | Silica gel (Sylysia 530 manufactured by Fuji Silysia Chemical Ltd., average particle diameter: 1.9 μm, average pore diameter: 25 angstroms, average specific surface: 500 $m^2/g$) |
| Example 11 | Magnesium hydroxide (manufactured by Wako Pure Chemical Industries, Ltd., average particle diameter: 0.6 μm, average pore diameter: 200 angstroms, average specific surface: 100 $m^2/g$) |
| Example 12 | Alumina RG30 (manufactured by Iwatani Chemical Industry Co., Ltd., average particle diameter: 0.5 μm, average pore diameter: 100 angstroms, average specific surface: 50 $m^2/g$)/rutile titanium oxide[1)] = 9/1 by weight |
| Example 13 | Alumina RG30 (manufactured by Iwatani Chemical Industry Co., Ltd., average particle diameter: 0.5 μm, average pore diameter: 100 angstroms, average specific surface: 50 $m^2/g$)/rutile titanium oxide[1)] = 3/1 by weight |
| Example 14 | Alumina RH30 (manufactured by Iwatani Chemical Industry Co., Ltd., average particle diameter: 1.5 μm, average pore diameter: 100 angstroms, average specific surface: 50 $m^2/g$)/zinc oxide[2)] = 9/1 by weight |
| Example 15 | Silica gel (Sylysia 320 manufactured by Fuji Silysia Chemical Ltd., average particle diameter: 1.6 μm, average pore diameter: 200 angstroms, average specific surface: 300 $m^2/g$)/zinc oxide[2)] = 4/1 by weight |
| Example 16 | Alumina RK30 (manufactured by Iwatani Chemical Industry Co., Ltd., average particle diameter: 0.6 μm, average pore diameter: 50 angstroms, average specific surface: 300 $m^2/g$)/Silica gel (Sylysia 320 manufactured by Fuji Silysia Chemical Ltd., average particle diameter: 1.6 μm, average pore diameter: 200 angstroms, average specific surface: 300 $m^2/g$) = 9/1 by weight |
| Example 17 | Alumina RK30 (manufactured by Iwatani Chemical Industry Co., Ltd., average particle diameter: 0.6 μm, average pore diameter: 50 angstroms, average specific surface: 300 $m^2/g$)/magnesium hydroxide (manufactured by Wako Pure Chemical Industries, Ltd., average particle diameter: 0.6 μm, average pore diameter: 200 angstroms, average specific surface: 100 $m^2/g$) = 3/1 by weight |

[1)]Rutile titanium oxide manufactured by Wako Pure Chemical Industries, Ltd. (average particle diameter: 0.3 μm, average pore diameter: less than one angstrom; average specific surface: 0.001 $m^2/g$)

[2)]Zinc oxide manufactured by Sakai Chemical Industry Co., Ltd. (average particle size: 0.3 μm, average pore diameter: less than one angstrom; average specific surface: 0.002 $m^2/g$)

With each of the lithographic printing plate precursors, the Bekk smoothness of the surface thereof was in a range of from 800 to 1,200 (sec/10 ml), and the contact angle of the surface thereof with water was not more than 5 degrees.

Each of the lithographic printing plate precursors was subjected to plate-making to prepare a printing plate and printing in the same manner as in Example 3. The printed matters obtained had clear images free from background stain in the non-image area similar to those obtained in Example 3. The printing durability of each lithographic printing plate was good as more than 30,000 sheets.

EXAMPLES 18 to 31

Lithographic printing plate precursors were prepared in the same manner as in Example 3 except for using each of the compounds shown in Table 2 below in place of the 5% aqueous solution of PVA117 (manufactured by Kuraray Co., Ltd.) as the organic polymer and the tetraethoxysilane as the silane compound.

TABLE 2

| Example | Organic Polymer | Silane Compound |
|---|---|---|
| Example 18 | PVA112 (manufactured by Kuraray Co., Ltd.) | Tetramethoxysilane (manufactured by Shin-Etsu Chemical Co., Ltd.) |
| Example 19 | Polyvinylpyrrolidone (manufactured by Wako Pure Chemical Industries, Ltd.) | Tetramethoxysilane (manufactured by Shin-Etsu Chemical Co., Ltd.) |
| Example 20 | Polyacrylamide (manufactured by Wako Pure Chemical Industries, Ltd.) | Tetramethoxysilane (manufactured by Shin-Etsu Chemical Co., Ltd.) |
| Example 21 | Polyethylene glycol (manufactured by Wako Pure Chemical Industries, Ltd.) | Tetramethoxysilane (manufactured by Shin-Etsu Chemical Co., Ltd.) |
| Example 22 | Hydroxypropyl-modified starch PENON-LD-1 (manufactured by Nippon Starch Chemical Co., Ltd.) | Tetraethoxysilane (manufactured by Shin-Etsu Chemical Co., Ltd.) |
| Example 23 | Polypropylene oxide-modified starch PENON-HV-2 (manufactured by Nippon Starch Chemical Co., Ltd.) | Tetraethoxysilane (manufactured by Shin-Etsu Chemical Co., Ltd.) |
| Example 24 | Polyethyleneimine (manufactured by Nippon Shokubai Co., Ltd.) | Tetraethoxysilane (manufactured by Shin-Etsu Chemical Co., Ltd.) |
| Example 25 | PVA405 (manufactured by Kuraray Co., Ltd.) | Tetramethoxysilane (manufactured by Shin-Etsu Chemical Co., Ltd.)/3-Aminopropyltrimethoxysilane (manufactured by Shin-Etsu Chemical Co., Ltd.) = 7/3 by weight |
| Example 26 | Polyvinylpyrrolidone (manufactured by Wako Pure Chemical Industries, Ltd.) | Tetramethoxysilane (manufactured by Shin-Etsu Chemical Co., Ltd.)/3-Sulfopropyltrimethoxysilane (manufactured by Shin-Etsu chemical Co., Ltd.) = 4/1 by weight |
| Example 27 | PVA117 (manufactured by Kuraray Co., Ltd.) | Tetramethoxysilane (manufactured by Shin-Etsu Chemical Co., Ltd.)/Trimethoxysilane (manufactured by Shin-Etsu Chemical Co., Ltd.) = 4/1 by weight |
| Example 28 | PVA117 (manufactured by Kuraray Co., Ltd.) | Tetrabutoxysilane (manufactured by Shin-Etsu Chemical Co., Ltd.) |
| Example 29 | PVA117 (manufactured by Kuraray Co., Ltd.) | 3-Aminopropyltrimethoxysilane (manufactured by Shin-Etsu Chemical Co., Ltd.) |
| Example 30 | Polyacrylamide (manufactured by Wako Pure Chemical Industries, Ltd.) | Tetraethoxysilane (manufactured by Shin-Etsu Chemical Co., Ltd.)/3-Hydroxypropyltrimethoxysilane (manufactured by Shin-Etsu Chemical Co., Ltd.) = 7/3 by weight |
| Example 31 | Hydroxypropyl-modified starch PENON LD-1 (manufactured by Nippon Starch Chemical Co., Ltd.) | Tetramethoxysilane (manufactured by Shin-Etsu Chemical Co., Ltd.)/Phenyltrimethoxysilane (manufactured by Shin-Etsu Chemical Co., Ltd.) = 19/1 by weight |

With each of the lithographic printing plate precursors, the Bekk smoothness of the surface thereof was in a range of from 800 to 1,200 (sec/10 ml), and the contact angle of the surface thereof with water was not more than 5 degrees.

Each of the lithographic printing plate precursors was subjected to plate-making to prepare a printing plate and printing in the same manner as in Example 3. The printed matters obtained had clear images free from background stain in the non-image area similar to those obtained in Example 3. The printing durability of each lithographic printing plate was good as more than 30,000 sheets.

EXAMPLE 32

The direct drawing-type lithographic printing plate precursor prepared in Example 3 was subjected to plate-making by a commercially available ink jet plate-making machine using a solid ink (Solid Ink Jet Plate Maker SJ120 manufactured by Hitachi Koki Co., Ltd.).

The duplicated images thus obtained on the printing plate precursor were visually evaluated through a magnifier of 20 magnifications, and it was found that the image quality was good. Specifically, the plate-making image formed from the solid ink jet plate-making machine had no disappearance of fine lines and fine letters and uniform solid image area. Also, no background stain due to scattering of ink was observed in the non-image area.

The lithographic printing plate precursor was subjected to plate-making in the same manner as described above. The lithographic printing plate thus prepared was then subjected to printing using a full-automatic printing machine (AM-2850 manufactured by AM Co., Ltd.), a solution prepared by diluting a PS plate processing agent (EU-3 manufactured by Fuji Photo Film Co., Ltd.) 50 times with distilled water and supplied in a dampening saucer as dampening water, and a black ink for offset printing. The 10th sheet was picked up in the course of printing, and the printed images thereon were visually evaluated for their image quality (background stain and uniformity in solid image area) through a magnifier of 20 magnifications. The image quality was excellent.

The printing procedure was further performed in the same manner as above. As a result, more than 30,000 sheets of good printed matters were obtained wherein disappearance of fine lines and fine letters and unevenness in solid portion were not observed in the image area, and stain due to adhesion of printing ink was not found in the non-image area.

The lithographic printing plate precursor of the present invention can provide a large number of good printed matters.

According to the use of the direct drawing type lithographic printing plate precursor of the present invention, images free from not only background stain over an entire surface but also dot-like stain can be formed thereon. Also, the direct drawing type lithographic printing plate precursor can prepare a lithographic printing plate capable of providing a great number of printed matters having clear images free from disappearance or distortion of image.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A direct drawing type lithographic printing plate precursor comprising a water-resistant support and an image-receiving layer, the image-receiving layer comprising a filler and a binder resin, wherein the filler comprises a porous filler, and the binder resin comprises a complex comprising a resin containing a bond in which a metal atom is connected with an oxygen atom and an organic polymer containing a group capable of forming a hydrogen bond with the resin.

2. The direct drawing type lithographic printing plate precursor as claimed in claim 1, wherein the porous filler has an average pore diameter distribution of from 1 angstrom to 1 μm.

3. The direct drawing type lithographic printing plate precursor as claimed in claim 1, wherein the porous filler has an average specific surface of from 0.05 to 5,000 $m^2/g$.

4. The direct drawing type lithographic printing plate precursor as claimed in claim 1, wherein the porous filler is composed of an inorganic substance.

5. The direct drawing type lithographic printing plate precursor as claimed in claim 1, wherein the porous filler is present in an amount of at least 25% by weight based on the total amount of the filler.

6. The direct drawing type lithographic printing plate precursor as claimed in claim 1, wherein a mixing ratio of the binder to the filler is from 80/20% by weight to 5/95% by weight in terms of the binder/the filler.

7. The direct drawing type lithographic printing plate precursor as claimed in claim 1, wherein the resin containing a bond in which a metal atom is connected with an oxygen atom is a polymer obtained by a hydrolysis polymerization condensation reaction of at least one matallic compound represented by the following formula (I):

$$(R^0)_nM^0(Y)_{z-n} \qquad (I)$$

wherein $R^0$ represents a hydrogen atoms, a hydrocarbon group or a heterocyclic group; Y represents a reactive group; $M^0$ represents a metal atom having a valence of from 3 to 6; z represents a valence of the metal atom MO; and n represents 0, 1, 2, 3 or 4, provided that the balance of z−n is not less than 2.

8. The direct drawing type lithographic printing plate precursor as claimed in claim 1, wherein the image-receiving layer has a surface smoothness of not less than 30 seconds/10 ml in terms of a Bekk smoothness.

9. The direct drawing type lithographic printing plate precursor as claimed in claim 1, wherein the organic polymer is a polymer containing at least one member selected from the group consisting of an amido bond, a urethane bond, a ureido bond and a hydroxy group.

10. The direct drawing type lithographic printing plate precursor as claimed in claim 9, wherein the organic polymer is an amide resin having an $—N(R^{11})CO—$ or $—N(R^{11})SO_2—$ bond, wherein $R^{11}$ represents a hydrogen atom, a hydrocarbon group or a heterocyclic group, a ureide resin having an —NHCONH—bond, or a urethane resin having an —NHCOO—bond.

11. The direct drawing type lithographic printing plate precursor as claimed in claim 9, wherein the organic polymer is a polymer containing a repeating unit represented by the following formula (II):

(II)

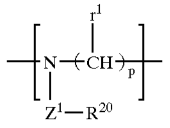

wherein, $Z^1$ represents —CO—, $—SO_2—$ or —CS—; $R^{20}$ represents a hydrogen atom, a hydrocarbon group or a heterocyclic group; $r^1$ represents a hydrogen atom or an alkyl group having from 1 to 6 carbon atoms, $r^1$s may be the same or different; and p represents an integer of 2 or 3.

12. The direct drawing type lithographic printing plate precursor as claimed in claim 1, wherein the complex has a weight ratio of the resin containing a bond in which a metal atom is connected with an oxygen atom/the organic polymer of from 10/90 to 90/10.

13. The direct drawing type lithographic printing plate precursor as claimed in claim 1, wherein the image-receiving layer has an average surface center roughness (SRa) defined in ISO-468 in the range of from 1.3 to 3.5 μm, and an average wavelength (Sγa) of not more than 50 μm.

14. The direct drawing type lithographic printing plate precursor as claimed in claim 1, wherein the image-receiving layer has a thickness of from 0.2 to 10 μm.

15. The direct drawing type lithographic printing plate precursor as claimed in claim 1, wherein the water-resistant support has a surface smoothness of not less than 300 seconds/10 ml in terms of a Bekk smoothness.

16. The direct drawing type lithographic printing plate precursor as claimed in claim 1, wherein the water-resistant support has a specific electric resistance of from $10^4$ to $10^{13}$ Ω·cm.

17. The direct drawing type lithographic printing plate precursor as claimed in claim 1, wherein the porous filler has an average particle diameter of from 0.03 to 20 μm.

* * * * *